United States Patent
Inoue

(10) Patent No.: US 12,413,200 B2
(45) Date of Patent: Sep. 9, 2025

(54) ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 279 days.

(21) Appl. No.: 18/210,710

(22) Filed: Jun. 16, 2023

(65) Prior Publication Data

US 2023/0327639 A1    Oct. 12, 2023

Related U.S. Application Data

(63) Continuation of application No. PCT/JP2021/046049, filed on Dec. 14, 2021.

(60) Provisional application No. 63/129,697, filed on Dec. 23, 2020.

(51) Int. Cl.
    H03H 9/02    (2006.01)

(52) U.S. Cl.
    CPC .... H03H 9/02228 (2013.01); H03H 9/02015 (2013.01); H03H 9/02086 (2013.01)

(58) Field of Classification Search
    CPC .......... H03H 9/02015; H03H 9/02228; H03H 9/174; H03H 9/02086
    See application file for complete search history.

(56) References Cited

U.S. PATENT DOCUMENTS

| | | |
|---|---|---|
| 2013/0057360 A1 | 3/2013 | Meltaus et al. |
| 2014/0145556 A1 | 5/2014 | Kadota |
| 2017/0324394 A1 | 11/2017 | Ebner et al. |
| 2019/0074813 A1 | 3/2019 | Zou et al. |
| 2019/0199321 A1 | 6/2019 | Nosaka |
| 2020/0373910 A1 | 11/2020 | Yantchev et al. |
| 2022/0360251 A1* | 11/2022 | Kay ........................ H03H 9/205 |

(Continued)

FOREIGN PATENT DOCUMENTS

| | | |
|---|---|---|
| JP | 2013528996 A | 7/2013 |
| JP | 2017204729 A | 11/2017 |

(Continued)

OTHER PUBLICATIONS

International Search Report in PCT/JP2021/046049, mailed Feb. 22, 2022, 4 pages.

(Continued)

*Primary Examiner* — Quan Tra

(74) *Attorney, Agent, or Firm* — Keating & Bennett, LLP

(57) ABSTRACT

An acoustic wave device includes a support, a piezoelectric layer, an IDT electrode including first and second busbars and first and second electrode fingers, and a first insulating film on the piezoelectric layer and that covers tip end portions of the second electrode fingers. In a multilayer body including the support and the piezoelectric layer, a cavity is provided on a side of the support with respect to the piezoelectric layer. In plan view, an outer peripheral edge of the cavity includes first and second outer peripheral edge portions facing each other in an electrode-finger extending direction. The first outer peripheral edge portion is on a side of the first busbar, and the first insulating film extends on the side of the first busbar, and, in plan view, overlaps the first outer peripheral edge portion of the cavity.

20 Claims, 13 Drawing Sheets

(56) References Cited

U.S. PATENT DOCUMENTS

| | | | | |
|---|---|---|---|---|
| 2023/0071909 A1* | 3/2023 | Daimon | ............ | H03H 9/14582 |
| 2023/0336143 A1* | 10/2023 | Kimura | ............ | H03H 9/02228 |

FOREIGN PATENT DOCUMENTS

| | | | |
|---|---|---|---|
| JP | 2017538365 A | 12/2017 | |
| WO | 2013021948 A1 | 2/2013 | |
| WO | 2018051846 A1 | 3/2018 | |

OTHER PUBLICATIONS

Written Opinion in PCT/JP2021/046049, mailed Feb. 22, 2022, 5 pages.

\* cited by examiner

ACOUSTIC WAVE DEVICE

CROSS REFERENCE TO RELATED APPLICATIONS

This application claims the benefit of priority to Provisional Application No. 63/129,697 filed on Dec. 23, 2020 and is a Continuation Application of PCT Application No. PCT/JP2021/046049 filed on Dec. 14, 2021. The entire contents of each application are hereby incorporated herein by reference.

BACKGROUND OF THE INVENTION

1. Field of the Invention

The present invention relates to an acoustic wave device.

2. Description of the Related Art

Hitherto, an acoustic wave device has been widely used in, for example, a filter of a cellular phone. International Publication No. 2013/021948 below discloses an example of an acoustic wave device using plate waves. In the acoustic wave device, an $LiNbO_3$ substrate is provided on a support member. A through hole is provided in the support member. An IDT (interdigital transducer) electrode is provided on a portion of the $LiNbO_3$ substrate, the portion facing the through hole.

SUMMARY OF THE INVENTION

In the acoustic wave device described in International Publication No. 2013/021948, a portion of a piezoelectric layer of, for example, an $LiNbO_3$ substrate, overlapping a cavity portion in plan view is capable of easily being deformed due to a pressure difference between the front and the back of the piezoelectric layer. Therefore, a tip end portion of an electrode finger of an IDT electrode may be peeled from the piezoelectric layer or an electrode finger may be torn.

Preferred embodiments of the present invention provide acoustic wave devices each being capable of reducing or preventing damage to an IDT electrode and peeling of the IDT electrode from a piezoelectric layer.

An acoustic wave device according to a preferred embodiment of the present invention includes a support including a support substrate, a piezoelectric layer on the support, an IDT electrode on the piezoelectric layer and including a first busbar and a second busbar facing each other and a plurality of electrode fingers, and a first insulating film on the piezoelectric layer and that covers tip end portions of the plurality of electrode fingers facing the first busbar, in which, in a multilayer body including the support and the piezoelectric layer, a cavity is provided on a side of the support with respect to the piezoelectric layer, and, in plan view, at least a portion of the IDT electrode overlaps the cavity portion, when a direction in which the plurality of electrode fingers extend is an electrode-finger extending direction, in plan view, an outer peripheral edge of the cavity portion includes a first outer peripheral edge portion and a second outer peripheral edge portion facing each other in the electrode-finger extending direction, and, of the first outer peripheral edge portion and the second outer peripheral edge portion, the first outer peripheral edge portion is positioned on a side of the first busbar, and the first insulating film extends on the side of the first busbar, and, in plan view, overlaps the first outer peripheral edge portion of the cavity portion.

According to the acoustic wave devices according to preferred embodiments of the present invention, it is possible to reduce or prevent damage to the IDT electrode and peeling of the IDT electrode from the piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
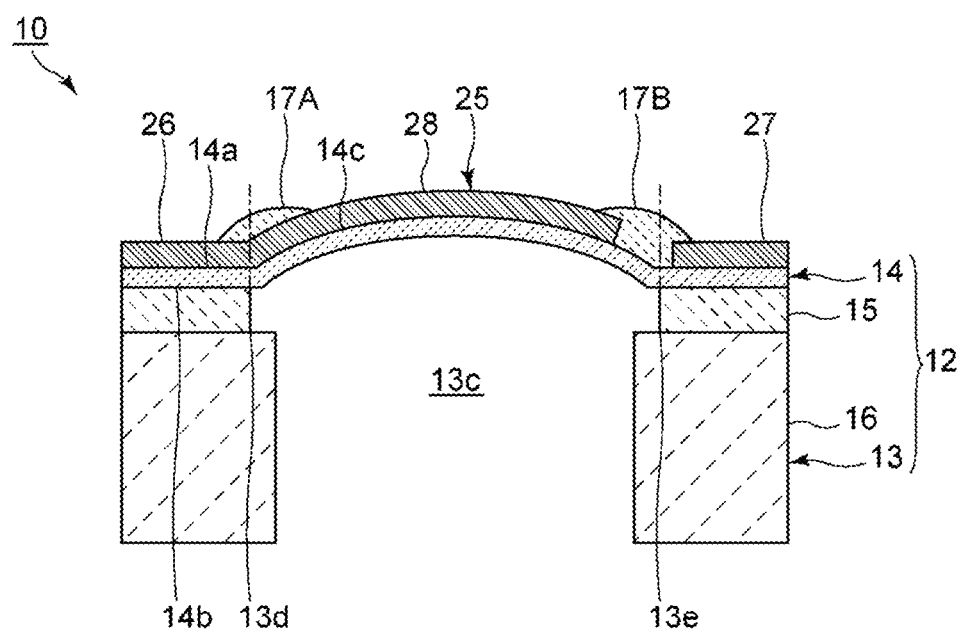
FIG. 1 is a schematic cross-sectional view of an acoustic wave device according to a first preferred embodiment of the present invention along a direction in which electrode fingers extend.

While referring to the drawings, specific preferred embodiments of the present invention will be described below to clarify the present invention.

Note that each preferred embodiment described in the present description is an example, and it will be pointed out that structures of different preferred embodiments can be partly replaced or combined.

Figure 2:
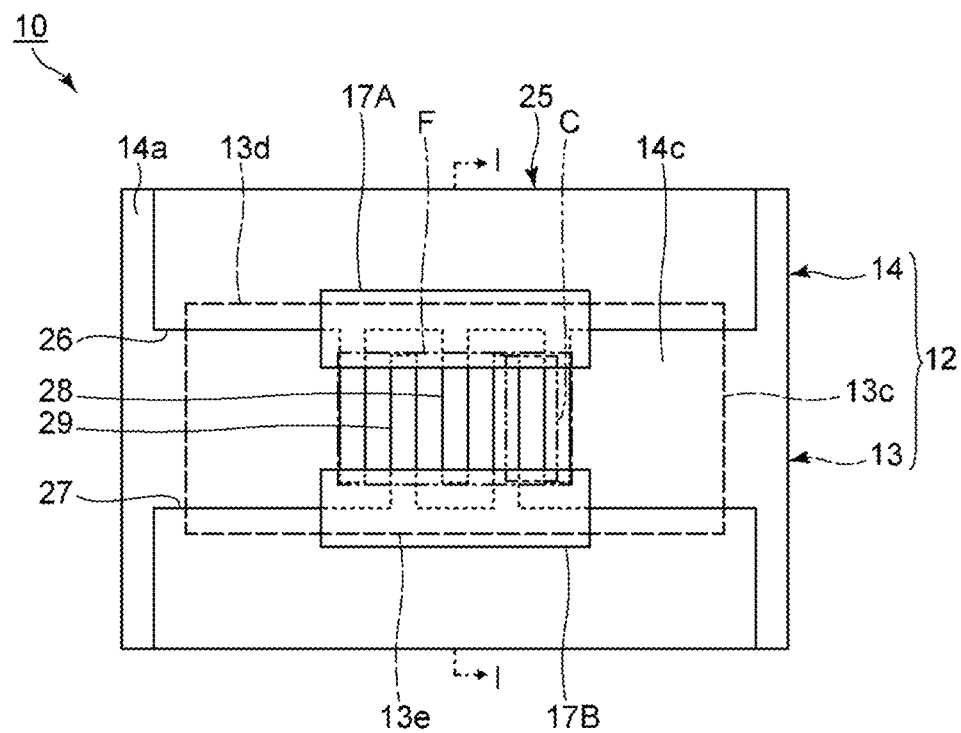
FIG. 2 is a schematic plan view of the acoustic wave device according to the first preferred embodiment of the present invention.

FIG. 1 is a schematic cross-sectional view of an acoustic wave device according to a first preferred embodiment of the present invention along a direction in which electrode fingers extend. FIG. 2 is a schematic plan view of the acoustic wave device according to the first preferred embodiment. Note that FIG. 1 is a schematic cross-sectional view along line I-I in FIG. 2. The electrode fingers are described below.

As shown in FIG. 1, an acoustic wave device 10 includes a piezoelectric substrate 12 and an IDT electrode 25. The piezoelectric substrate 12 includes a support member 13 and a piezoelectric layer 14. In the present preferred embodiment, the support member 13 includes a support substrate 16 and a joining layer 15 as an insulating layer. The joining layer 15 is provided on the support substrate 16. The piezoelectric layer 14 is provided on the joining layer 15. However, the support member 13 may be defined by only the support substrate 16.

A cavity portion 13c is provided in the support member 13. More specifically, a through hole is provided in the joining layer 15. A through hole is provided in the support substrate 16 so as to communicate with the through hole of the joining layer 15. Note that, instead of a through hole, a recessed portion may be provided in the support substrate 16. The piezoelectric layer 14 is provided on the joining layer 15 so as to close the through hole. Therefore, the cavity portion 13c of the support member 13 is formed. In this way, in the present preferred embodiment, the cavity portion 13c is formed in both the support substrate 16 and the joining layer 15. However, the cavity portion 13c may be formed in only the joining layer 15. Alternatively, the cavity portion 13c may be formed in only the support substrate 16.

As a material of the joining layer 15, an appropriate dielectric, such as silicon oxide or tantalum pentoxide, can be used. As a material of the support substrate 16, for example, a semiconductor, such as silicon, or an appropriate ceramic material can be used.

The piezoelectric layer 14 includes a first main surface 14a and a second main surface 14b. The first main surface 14a and the second main surface 14b face each other. Of the first main surface 14a and the second main surface 14b, the second main surface 14b is the main surface on a side of the support member 13. The piezoelectric layer 14 includes a membrane portion 14c. The membrane portion 14c is a portion of the piezoelectric layer 14 that overlaps the cavity portion 13c in plan view. The membrane portion 14c has a shape that curves in a protruding form on a side of the first main surface 14a. However, the membrane portion 14c need not have a curved shape.

The piezoelectric layer 14 is made of, for example, lithium niobate, such as LiNbO$_3$, or lithium tantalate, such as LiTaO$_3$. In the present description, "a certain member is made of a certain material" includes a case in which a very small amount of impurities that does not cause deterioration in the electrical characteristics of the acoustic wave device is contained.

The IDT electrode 25 is provided on the first main surface 14a of the piezoelectric layer 14. At least a portion of the IDT electrode 25 overlaps the cavity portion 13c of the support member 13 in plan view. In the present description, "in plan view" refers to a view from a direction corresponding to an upper direction in FIG. 1.

As shown in FIG. 2, the IDT electrode 25 includes a first busbar 26 and a second busbar 27, which are a pair of busbars, a plurality of first electrode fingers 28, and a plurality of second electrode fingers 29. Each first electrode finger 28 is a first electrode in the present invention. The plurality of first electrode fingers 28 are periodically disposed. One end portion of each of the plurality of first electrode fingers 28 is connected to the first busbar 26. Tip end portions, which are the other end portions, of the plurality of first electrode fingers 28 each face the second busbar 27. Each second electrode finger 29 is a second electrode. The plurality of second electrode fingers 29 are periodically disposed. One end portion of each of the plurality of second electrode fingers 29 is connected to the second busbar 27. Tip end portions, which are the other end portions, of the plurality of second electrode fingers 29 each face the first busbar 26. The plurality of first electrode fingers 28 and the plurality of second electrode fingers 29 interdigitate with respect to each other.

The IDT electrode 25 may be formed from a multilayer metal film, or may be formed from a single-layer metal film. In the description below, the first electrode fingers 28 and the second electrode fingers 29 may simply be referred to as electrode fingers.

A first insulating film 17A is provided on the first main surface 14a of the piezoelectric layer 14. More specifically, the first insulating film 17A covers the tip end portions of the plurality of second electrode fingers 29. The first insulating film 17A extends from a side of the tip end portions of the plurality of second electrode fingers 29 to the first busbar 26. In plan view, the first insulating film 17A overlaps an outer peripheral edge of the cavity portion 13c of the support member 13. Note that the outer peripheral edge of the cavity portion 13c in the present preferred embodiment refers to an outer peripheral edge defining the through hole of the joining layer 15 in plan view.

More specifically, in the present preferred embodiment, the shape of the cavity portion 13c in plan view is a rectangular or substantially rectangular shape. The outer peripheral edge of the cavity portion 13c includes a first outer peripheral edge portion 13d and a second outer peripheral edge portion 13e. The first outer peripheral edge portion 13d and the second outer peripheral edge portion 13e correspond to a pair of sides of a rectangle. When a direction in which the plurality of electrode fingers extend is an electrode-finger extending direction, the first outer peripheral edge portion 13d and the second outer peripheral edge portion 13e face each other in the electrode-finger extending direction. Of the first outer peripheral edge portion 13d and the second outer peripheral edge portion 13e, the first outer peripheral edge portion 13d is positioned on a side of the first busbar 26. The first outer peripheral edge portion 13d and the second outer peripheral edge portion 13e have linear shapes. However, the first outer peripheral edge portion 13d and the second outer peripheral edge portion 13e may have curved shapes.

An alternate long and short dashed line in FIG. 1 denotes a portion that overlaps the first outer peripheral edge portion 13d in plan view and a portion that overlaps the second outer peripheral edge portion 13e in plan view. In plan view, the first insulating film 17A overlaps the first outer peripheral edge portion 13d. More specifically, the first insulating film 17A covers a boundary between a region where the cavity portion 13c and the piezoelectric layer 14 overlap each other in plan view and where the cavity portion 13c and the piezoelectric layer 14 do not overlap each other in plan view.

A second insulating film 17B is provided on the first main surface 14a of the piezoelectric layer 14. More specifically, the second insulating film 17B covers the tip end portions of the plurality of first electrode fingers 28. The second insulating film 17B extends from a side of the tip end portions of the plurality of first electrode fingers 28 to the second busbar 27. In plan view, the second insulating film 17B overlaps the second outer peripheral edge portion 13e of the cavity portion 13c of the support member 13.

The first insulating film 17A and the second insulating film 17B may each be, for example, an inorganic insulating film or a resin film. When the first insulating film 17A and the second insulating film 17B are inorganic insulating films, for example, silicon oxide can be used. Silicon oxide is, for example, $SiO_2$. When the first insulating film 17A and the second insulating film 17B are resin films, for example, polyimide can be used.

A feature of the present preferred embodiment is that the first insulating film 17A covers the tip end portions of the plurality of second electrode fingers 29 and, in plan view, covers the first outer peripheral edge portion 13d of the cavity portion 13c. Therefore, it is possible to reduce or prevent damage to the IDT electrode 25 and peeling of the IDT electrode 25 from the piezoelectric layer 14. This is described below by comparing the present preferred embodiment and a comparative example.

Figure 3A:
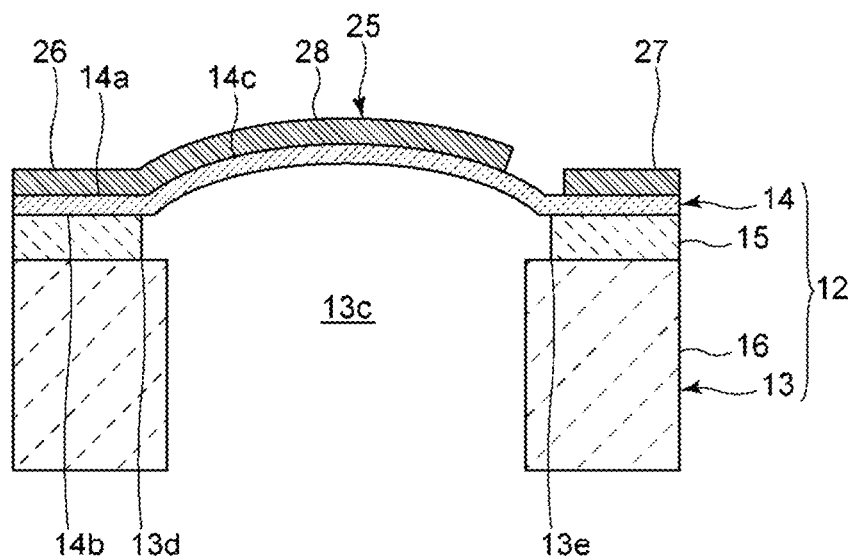
FIG. 3A is a schematic cross-sectional view of an acoustic wave device of a comparative example along a direction in which electrode fingers extend.
Figure 3B:
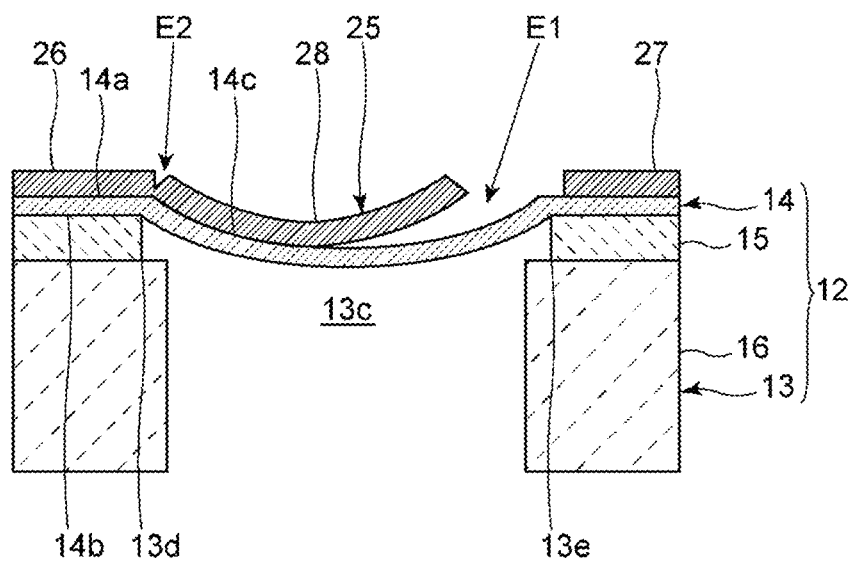
FIG. 3B is a schematic cross-sectional view showing an example when the acoustic wave device of the comparative example has been deformed due to a pressure difference between two main surfaces.

As shown in FIG. 3A, in the comparative example, a first insulating film and a second insulating film are not provided. Pressure applied to each of a first main surface 14a and a second main surface 14b of a piezoelectric layer 14 changes due to, for example, an external environment. Therefore, for example, as shown in FIG. 3B, the shape of a membrane portion 14c of the piezoelectric layer 14 may change to a shape that curves in a protruding form on a side of the second main surface 14b. Due to such a change in the shape of the piezoelectric layer 14, as shown by arrow E1, tip ends of electrode fingers may be peeled, or, as shown by arrow E2, portions of the electrode fingers near base ends thereof may be torn.

In contrast, in the present preferred embodiment shown in FIG. 1, the first insulating film 17A covers the tip end portions of the plurality of second electrode fingers 29. Therefore, it is possible to reduce or prevent peeling of the tip end portions of the plurality of second electrode fingers 29.

In addition, in plan view, the first insulating film 17A covers the first outer peripheral edge portion 13d of the cavity portion 13c of the support member 13. More specifically, in the present preferred embodiment, the first outer peripheral edge portion 13d overlaps the first busbar 26 in plan view. Therefore, the first insulating film 17A covers a portion of the first busbar 26 and the base ends of the first electrode fingers 28. Therefore, it is possible to reduce or prevent tearing of portions of the plurality of first electrode fingers 28 near the base ends thereof.

Note that, in plan view, the first outer peripheral edge portion 13d need not overlap the first busbar 26. For example, in plan view, the first outer peripheral edge portion 13d may overlap a region between the first busbar 26 and the tip end portions of the plurality of second electrode fingers 29. Even in this case, it is possible to reduce or prevent tearing of the portions of the plurality of first electrode fingers 28 that are covered by the first insulating film 17A.

As in the present preferred embodiment, it is preferable that the second insulating film 17B cover the tip end portions of the plurality of first electrode fingers 28 and that, in plan view, the second insulating film 17B cover the second outer peripheral edge portion 13e of the cavity portion 13c of the support member 13. This makes it possible to reduce or prevent peeling of the tip end portions of the plurality of first electrode fingers 28 and tearing of the plurality of second electrode fingers 29.

As described above, the membrane portion 14c of the piezoelectric layer 14 has a shape that curves in a protruding form on the side of the first main surface 14a. In obtaining the piezoelectric substrate 12 of the present preferred embodiment, for example, in a state in which the piezoelectric layer 14 is laminated on the support member 13, when the thickness of the piezoelectric layer 14 is to be adjusted, processing pressure of, for example, polishing of the piezoelectric layer 14 may be adjusted such that the shape of the piezoelectric layer 14 becomes the aforementioned shape. Alternatively, for example, the piezoelectric layer 14 that is separately provided and that has the aforementioned shape may be joined to the support member 13.

When a direction in which electrode fingers that are adjacent to each other face each other is an electrode-finger facing direction, in the present preferred embodiment, as shown in FIG. 2, the electrode-finger facing direction is orthogonal to the electrode-finger extending direction. In the present description, the electrode-finger facing direction means the same as the direction in which the plurality of electrode fingers are disposed side by side. A region in which the electrode fingers that are adjacent to each other overlap each other when viewed from the electrode-finger facing direction is an intersection region F. The intersection region F is a region including a portion of the IDT electrode 25 from an electrode finger at one end in the electrode-finger facing direction to an electrode finger on the other end in the electrode-finger facing direction. More specifically, the intersection region F includes a portion from an outer edge portion in the electrode-finger facing direction of the electrode finger at the one end to an outer edge portion in the electrode-finger facing direction of the electrode finger at the other end.

Further, the acoustic wave device 10 includes a plurality of excitation regions C. Acoustic waves are excited in the plurality of excitation regions C by applying an alternating-current voltage to the IDT electrode 25. In the present preferred embodiment, the acoustic wave device 10 is configured to be capable of using, for example, bulk waves in a thickness shear mode, such as a thickness shear primary mode. Similarly to the intersection region F, each excitation region C is a region in which the electrode fingers that are adjacent to each other overlap each other when viewed from the electrode-finger facing direction. Note that each excitation region C is a region between a pair of electrode fingers. More specifically, each excitation region C is a region from the center of one of the electrode fingers in the electrode-finger facing direction to the center of the other electrode finger in the electrode-finger facing direction. Therefore, the intersection region F includes the plurality of excitation regions C. However, the acoustic wave device 10 may be configured to be capable of using, for example, plate waves. When the acoustic wave device 10 uses plate waves, the intersection region F becomes an excitation region.

As shown in FIG. 2, the first insulating film 17A and the second insulating film 17B are provided at portions of the intersection region F where the tip end portions of the plurality of electrode fingers are positioned. On the other hand, the first insulating film 17A and the second insulating film 17B are not provided at portions of the intersection region F other than the portions thereof where the tip end portions of the plurality of electrode fingers are positioned. In this way, the first insulating film 17A and the second insulating film 17B are not provided at a portion of the intersection region F. However, the first insulating film 17A and the second insulating film 17B may be provided at the entire intersection region F.

Figure 4:
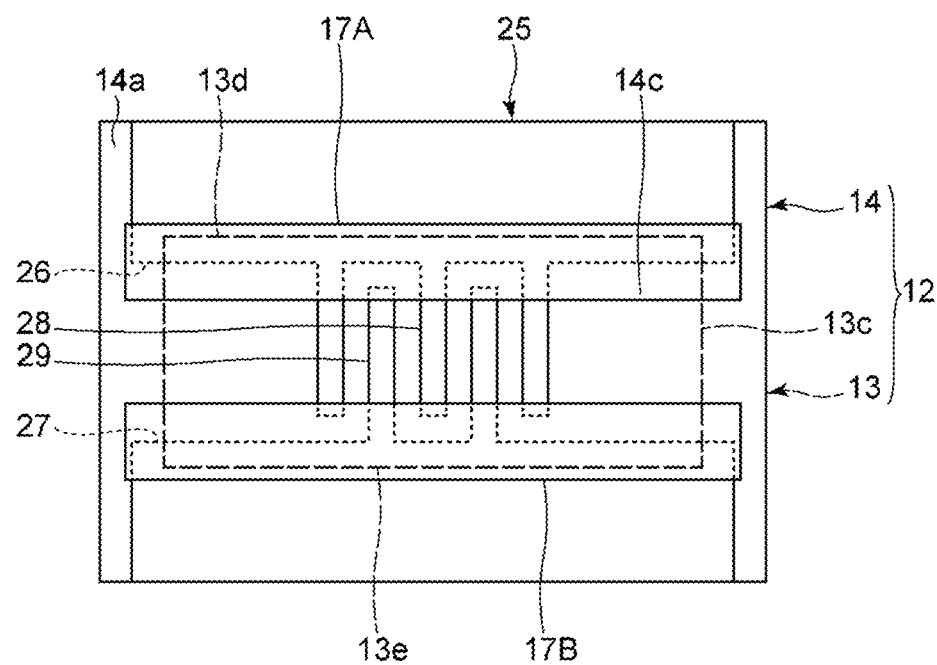
FIG. 4 is a schematic plan view of an acoustic wave device according to a first modification of the first preferred embodiment of the present invention.

In the present preferred embodiment, the first insulating film 17A covers a portion of the first busbar 26 in the electrode-finger facing direction. Similarly, the second insulating film 17B covers a portion of the second busbar 27 in the electrode-finger facing direction. However, it is not limited thereto. For example, in a first modification of the first preferred embodiment shown in FIG. 4, the first insulating film 17A covers the entire first busbar 26 in the electrode-finger facing direction. The second insulating film 17B covers the entire second busbar 27 in the electrode-finger facing direction. Even in this case, it is possible to reduce or prevent damage to the IDT electrode 25 and peeling of the IDT electrode 25 from the piezoelectric layer 14.

As described above, the cavity portion 13c of the support member 13 is formed in both of the joining layer 15 and the support substrate 16. Note that, it is sufficient for, in a multilayer body including the support member 13 and the piezoelectric layer 14, the cavity portion 13c to be provided on a side of the support member 13 with respect to the piezoelectric layer 14. In the description below, second to fourth modifications of the first preferred embodiment that differ from the first preferred embodiment in only the structure of the support member 13 are described. Even in the second to fourth modifications, similarly to the first preferred embodiment, it is possible to reduce or prevent damage to the IDT electrode 25 and peeling of the IDT electrode 25 from the piezoelectric layer 14.

Figure 5:
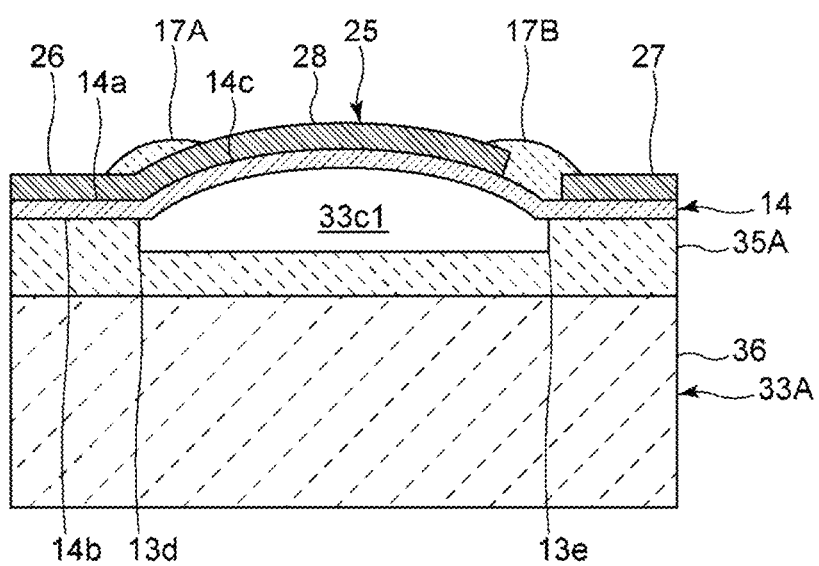
FIG. 5 is a schematic cross-sectional view of an acoustic wave device according to a second modification of the first preferred embodiment of the present invention along a direction in which electrode fingers extend.

In the second modification shown in FIG. 5, a recessed portion is provided in only a joining layer 35A. A recessed portion and a through hole are not provided in the support substrate 36. Therefore, a cavity portion 33c1 of a support member 33A is formed in only the joining layer 35A.

Figure 6:
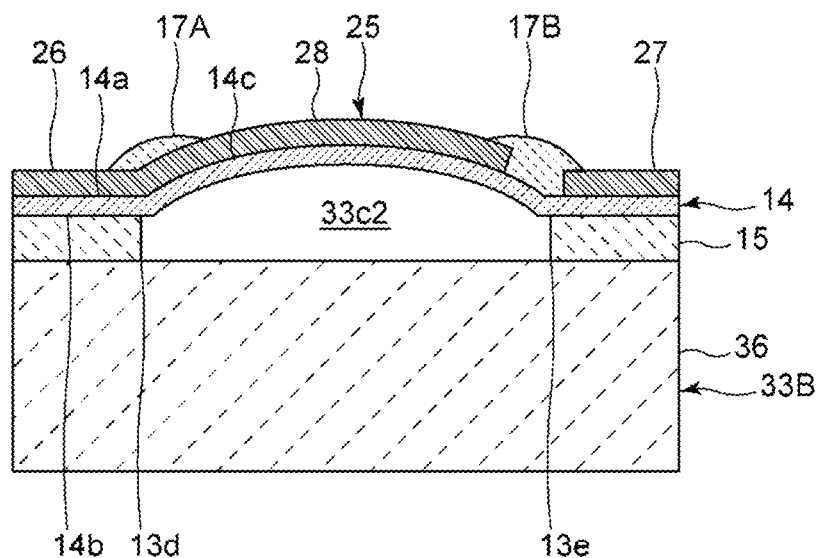
FIG. 6 is a schematic cross-sectional view of an acoustic wave device according to a third modification of the first preferred embodiment of the present invention along a direction in which electrode fingers extend.

In the third modification shown in FIG. 6, similarly to the first preferred embodiment, a through hole is provided in the joining layer 15. On the other hand, a recessed portion and a through hole are not provided in a support substrate 36. Therefore, a cavity portion 33c2 of a support member 33B is formed in only the joining layer 15.

Figure 7:
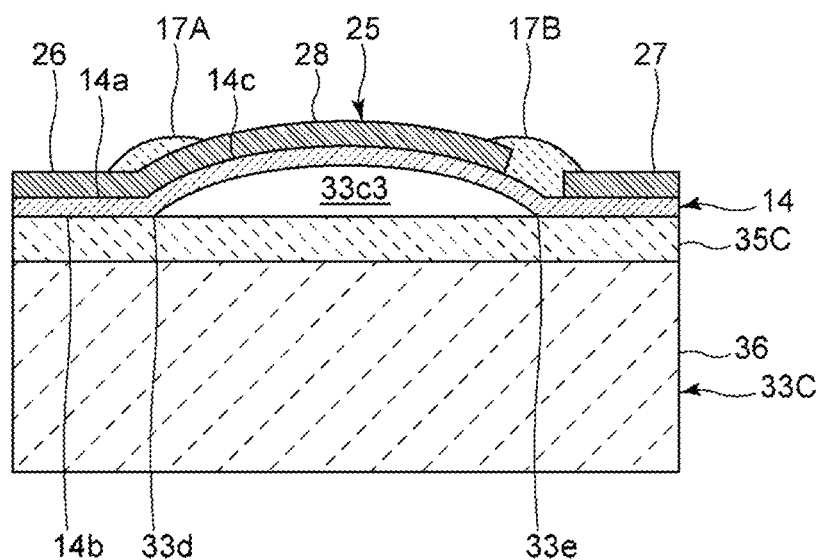
FIG. 7 is a schematic cross-sectional view of an acoustic wave device according to a fourth modification of the first preferred embodiment of the present invention along a direction in which electrode fingers extend.

In the fourth modification shown in FIG. 7, a cavity portion 33c3 is provided between a support member 33C and the piezoelectric layer 14. More specifically, a recessed portion and a through hole are not provided in a support substrate 36 and a joining layer 35C. Therefore, the cavity portion 33c3 is not formed in the support member 33C. On the other hand, similarly to the first preferred embodiment, a portion of the piezoelectric layer 14 has a shape that curves in a protruding form on the side of the first main surface 14a. Therefore, the cavity portion 33c3 is provided between the support member 33C and the piezoelectric layer 14. A portion of the piezoelectric layer 14 facing the cavity portion 33c3 is a membrane portion 14c in the present modification. Note that, in the present modification, a boundary between a portion where the piezoelectric layer 14 and the joining layer 35C contact each other and a portion where they do not contact each other is an outer peripheral edge of the cavity portion 33c3. A portion of the outer peripheral edge corresponding to a side thereof on a side of the first busbar 26 is a first outer peripheral edge portion 33d. A portion of the outer peripheral edge corresponding to a side thereof on a side of the second busbar 27 is a second outer peripheral edge portion 33e.

As shown in FIG. 2, in the first preferred embodiment, the first insulating film 17A and the second insulating film 17B are provided as separate films. However, the first insulating film 17A and the second insulating film 17B may be integrally provided. This example is described in a second preferred embodiment and a third preferred embodiment below. Note that an acoustic wave device of the second preferred embodiment and an acoustic wave device of the third preferred embodiment have the same structures as that of the acoustic wave device 10 of the first preferred embodiment except that an insulating film including a first insulating film 17A and a second insulating film 17B is provided. Even in the second preferred embodiment and the third preferred embodiment, similarly to the first preferred embodiment, it is possible to reduce or prevent damage to an IDT electrode 25 and peeling of the IDT electrode 25 from a piezoelectric layer 14.

Figure 8:
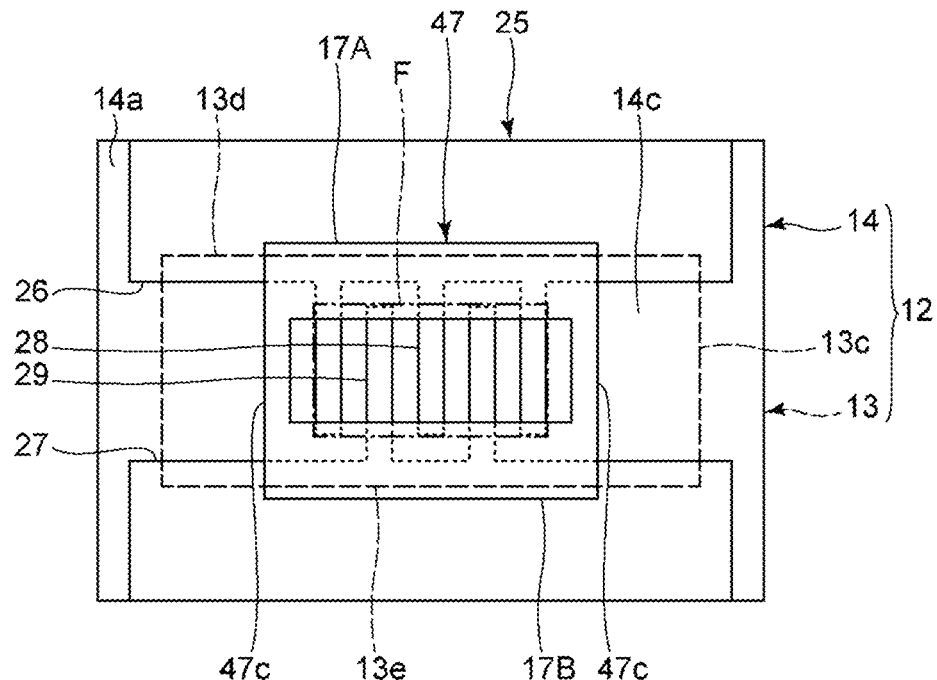
FIG. 8 is a schematic plan view of an acoustic wave device according to a second preferred embodiment of the present invention.

FIG. 8 is a schematic plan view of the acoustic wave device according to the second preferred embodiment.

In the present preferred embodiment, an insulating film 47 is provided on a first main surface 14a of the piezoelectric layer 14. The insulating film 47 is an insulating film in which the first insulating film 17A and the second insulating film 17B are integrated with each other. The insulating film 47 includes the first insulating film 17A, the second insulating film 17B, and two connection portions 47c. One connection portion 47c connects an end portion of the first insulating film 17A to an end portion of the second insulating film 17B, and the other connection portion 47c connects the other end portion of the first insulating film 17A to the other end portion of the second insulating film 17B, the end portions being those in a direction parallel to the electrode-finger facing direction to each other. The insulating film 47 is not provided at portions of an intersection region F other than portions where tip end portions of a plurality of electrode fingers are positioned.

Figure 9:
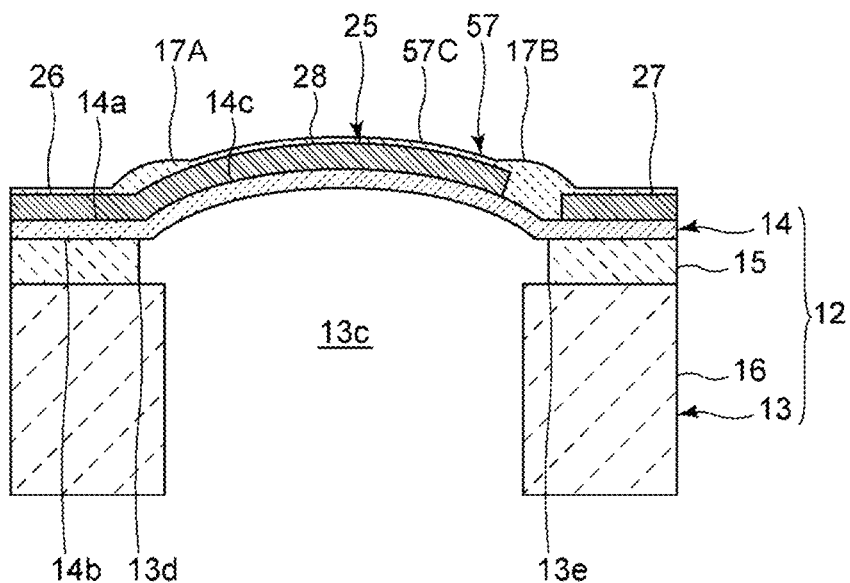
FIG. 9 is a schematic cross-sectional view of an acoustic wave device according to a third preferred embodiment of the present invention along a direction in which electrode fingers extend.

FIG. 9 is a schematic cross-sectional view of the acoustic wave device according to the third preferred embodiment along a direction in which electrode fingers extend.

In the present preferred embodiment, an insulating film 57 is provided on a first main surface 14a of the piezoelectric layer 14. The insulating film 57 is an insulating film in which the first insulating film 17A and the second insulating film 17B are integrated with each other. More specifically, the insulating film 57 is provided on the first main surface 14a so as to cover the entire IDT electrode 25. At a portion where the IDT electrode 25 is provided, the piezoelectric layer 14, the IDT electrode 25, and the insulating film 57 are placed upon each other in this order. In the present preferred embodiment, the entire intersection region F is covered by the insulating film 57.

The insulating film 57 includes the first insulating film 17A, the second insulating film 17B, and a third insulating film 57C. In the present preferred embodiment, the first insulating film 17A corresponds to a portion that covers tip end portions of a plurality of second electrode fingers 29 in the insulating film 57 and that, in plan view, overlaps a first outer peripheral edge portion 13d of a cavity portion 13c of a support member 13. The second insulating film 17B corresponds to a portion that covers tip end portions of a plurality of first electrode fingers 28 in the insulating film 57 and that, in plan view, overlaps a second outer peripheral edge portion 13e. The third insulating film 57C forms all portions of the insulating film 57 other than the first insulating film 17A and the second insulating film 17B.

In the present preferred embodiment, the first insulating film 17A and the second insulating film 17B are thicker than the third insulating film 57C. Therefore, it is possible to effectively reduce or prevent damage to the IDT electrode 25 and peeling of the IDT electrode 25 from the piezoelectric layer 14. Note that the thicknesses of the first insulating film 17A and the second insulating film 17B may be the same as the thickness of the third insulating film 57C.

Figure 10:
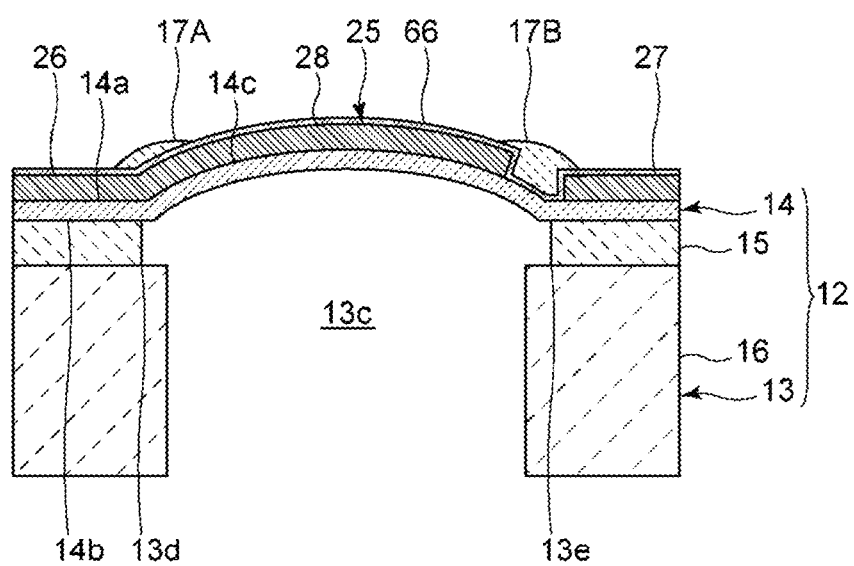
FIG. 10 is a schematic cross-sectional view of an acoustic wave device according to a fourth preferred embodiment of the present invention along a direction in which electrode fingers extend.

FIG. 10 is a schematic cross-sectional view of an acoustic wave device according to a fourth preferred embodiment along a direction in which electrode fingers extend.

The present preferred embodiment differs from the first preferred embodiment in that a dielectric film 66 is provided on a first main surface 14a of a piezoelectric layer 14 so as to cover the entire IDT electrode 25. The dielectric film 66 is provided between the piezoelectric layer 14 and the IDT electrode 25 and the first insulating film 17A and the second insulating film 17B. In terms of points other than the aforementioned points, the structure of the acoustic wave device of the present preferred embodiment is the same as the structure of the acoustic wave device 10 of the first preferred embodiment.

The material of the dielectric film 66 differs from the materials of the first insulating film 17A and the second insulating film 17B. As the material of the dielectric film 66, for example, silicon oxide, silicon nitride, or silicon oxynitride can be used.

In the present preferred embodiment, since the IDT electrode 25 is covered by the dielectric film 66, the IDT electrode 25 is unlikely to be damaged. However, it is sufficient for the dielectric film 66 to cover at least a portion of the IDT electrode 25.

Further, even in the present preferred embodiment, similarly to the first preferred embodiment, the first insulating film 17A and the second insulating film 17B are provided. Therefore, a multilayer body including the first insulating film 17A and the dielectric film 66 covers tip end portions of a plurality of second electrode fingers 29, and, in plan view, overlaps a first outer peripheral edge portion 13d of a cavity portion 13c of a support member 13. A multilayer body including the second insulating film 17B and the dielectric film 66 covers tip end portions of a plurality of first electrode fingers 28, and, in plan view, overlaps a second outer peripheral edge portion 13e. Therefore, it is possible to further reduce or prevent damage to the IDT electrode 25 and peeling of the IDT electrode 25 from the piezoelectric layer 14.

Details of an acoustic wave device using bulk waves in a thickness shear mode are described below. Note that an insulating layer below corresponds to the above-described joining layer. Note that a support member below corresponds to the above-described support substrate.

Figure 11A:
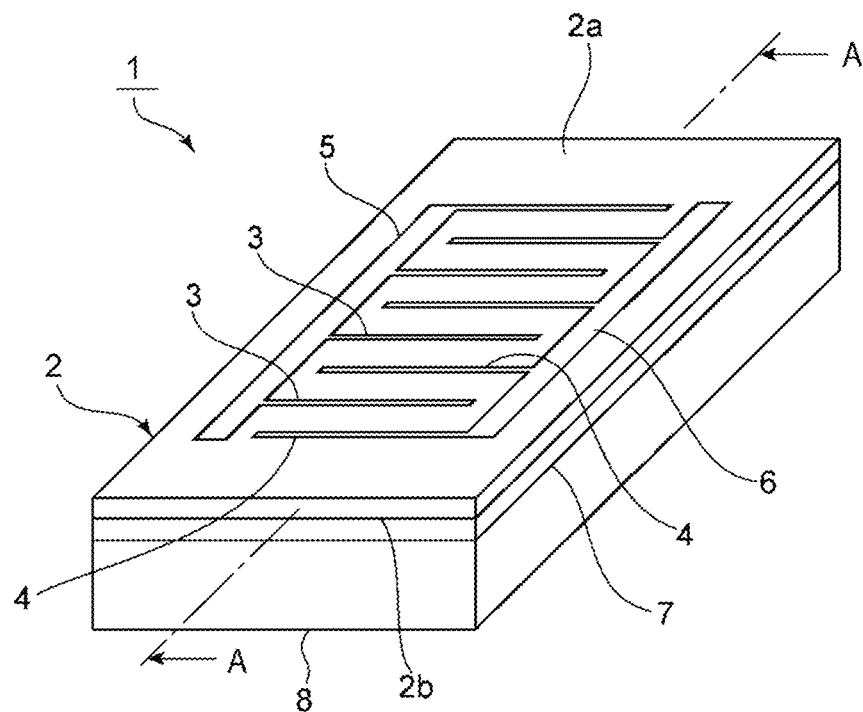
FIG. 11A is a schematic perspective view showing the exterior of an acoustic wave device using bulk waves in a thickness shear mode.
Figure 11B:
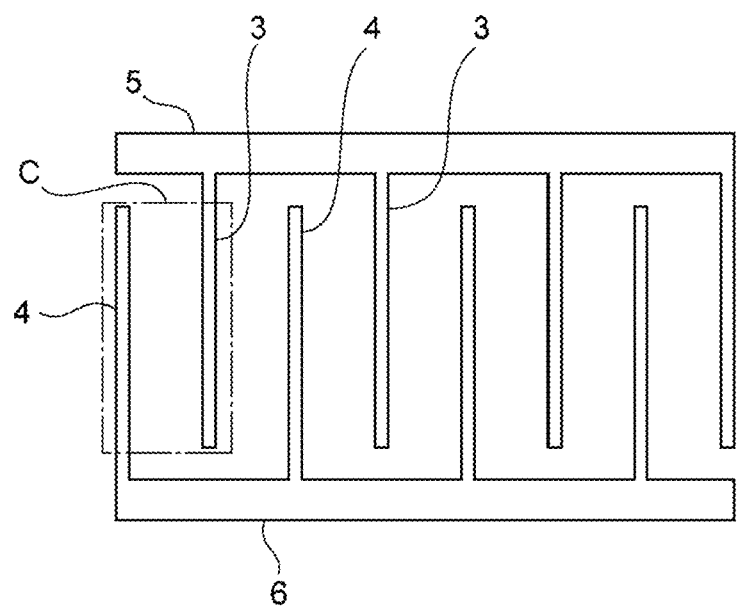
FIG. 11B is a plan view showing an electrode structure at a piezoelectric layer.
Figure 12:
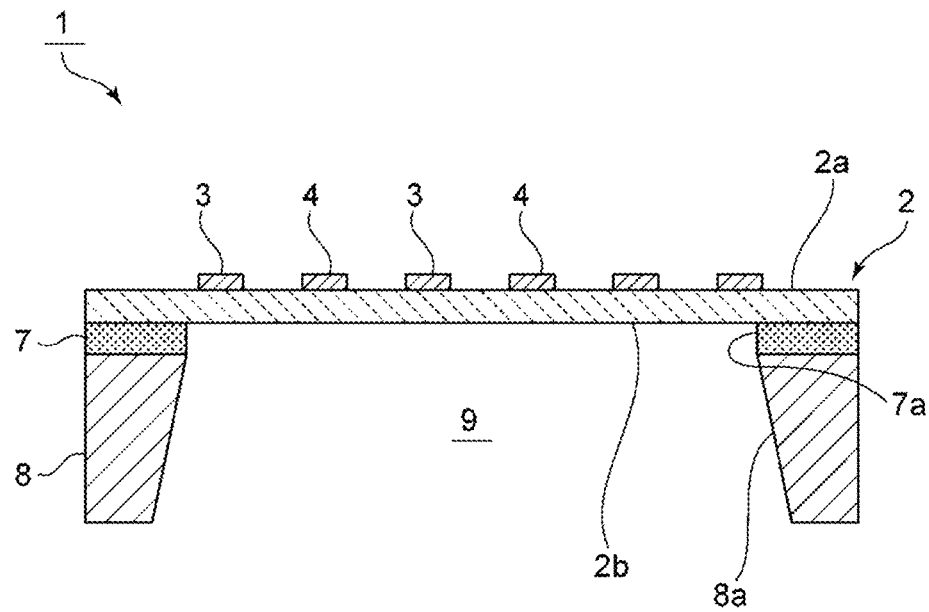
FIG. 12 is a cross-sectional view of a portion along line A-A in FIG. 11A.

FIG. 11A is a schematic perspective view showing the exterior of an acoustic wave device using bulk waves in a thickness shear mode, FIG. 11B is a plan view showing an electrode structure at a piezoelectric layer, and FIG. 12 is a cross-sectional view of a portion along line A-A in FIG. 11A.

An acoustic wave device 1 has a piezoelectric layer 2 made of $LiNbO_3$. The piezoelectric layer 2 may be made of $LiTaO_3$. Although the cut-angle of $LiNbO_3$ and $LiTaO_3$ is Z-cut, the cut-angle may be rotation Y-cut or X-cut. Although the thickness of the piezoelectric layer 2 is not particularly limited, the thickness of the piezoelectric layer 2 is preferably more than or equal to about 40 nm and less than or equal to about 1000 nm and more preferably more than or equal to about 50 nm and less than or equal to about 1000 nm to excite the thickness shear mode effectively. The piezoelectric layer 2 includes a first main surface 2a and a second main surface 2b that face each other. An electrode 3 and an electrode 4 are provided on the first main surface 2a. Here, the electrode 3 is one example of the "first electrode", and the electrode 4 is one example of the "second electrode". In FIGS. 11A and 11B, a plurality of the electrodes 3 are connected to a first busbar 5. A plurality of the electrodes 4 are connected to a second busbar 6. The plurality of electrodes 3 and the plurality of electrodes 4 interdigitate with each other. The electrodes 3 and the electrodes 4 each have a rectangular or substantially rectangular shape and have a length direction. In a direction orthogonal to this length direction, each electrode 3 faces adjacent one or ones of the electrodes 4. The length directions of the electrodes 3 and 4 and a direction orthogonal to the length directions of the electrodes 3 and 4 are each a direction intersecting the thickness direction of the piezoelectric layer 2. Therefore, it can be said that each electrode 3 and the adjacent one or ones of the electrodes 4 face each other in the direction intersecting the thickness direction of the piezoelectric layer 2. The length directions of the electrodes 3 and 4 may be replaced with a direction orthogonal to the length directions of the electrodes 3 and 4 illustrated in FIGS. 11A and 11B. In other words, in FIGS. 11A and 11B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 11A and 11B. Then, a plurality of pairs of a structure in each of which the electrode 3 connected to one potential and the electrode 4 connected to the other potential are adjacent to each other are provided in the direction orthogonal to the length directions of the aforementioned electrodes 3 and 4. Here, "the electrode 3 and the electrode 4 are adjacent to each other" does not refer to a case in which the electrode 3 and the electrode 4 are disposed in direct contact with each other but refers to a case in which the electrode 3 and the electrode 4 are disposed with a gap interposed therebetween. When the electrode 3 and the electrode 4 are adjacent to each other, electrodes, including the other electrodes 3 and 4, connected to a hot electrode and a ground electrode are not disposed between the electrode 3 and the electrode 4. The number of the pairs is not necessarily an integer number and may be, for example, 1.5 or 2.5. A center-to-center distance, that is, a pitch between the electrode 3 and the electrode 4 is preferably within the range from about 1 µm to about 10 µm, for example. The width of each of the electrodes 3 and 4, that is, the dimension thereof in the facing direction of the electrodes 3 and 4 is preferably within the range from about 50 nm to about 1000 nm and more preferably within the range from about 150 nm to about 1000 nm, for example. Note that the center-to-center distance between the centers of the electrodes 3 and 4 is a distance that connects the center of the dimension (width dimension) of the electrode 3 in a direction orthogonal to the length direction of the electrode 3 and the center of a dimension (width dimension) of the electrode 4 in a direction orthogonal to the length direction of the electrode 4 to each other.

In the acoustic wave device 1, a Z-cut piezoelectric layer is used, and thus, the directions orthogonal to the length directions of the electrodes 3 and 4 are directions orthogonal to a polarization direction of the piezoelectric layer 2. The above is not applicable to a case where a piezoelectric body of other cut-angles is used as the piezoelectric layer 2. Here, "orthogonal" does not only refer to orthogonal in the strict sense and may refer to "substantially orthogonal" (an angle formed by the direction orthogonal to the length direction of the electrode 3 or 4 and the polarization direction may be, for example, in the range of about 90°±10°).

A support member 8 is laminated on the side of the second main surface 2b of the piezoelectric layer 2 with an insulating layer 7 interposed therebetween. The insulating layer 7 and the support member 8 each have a frame shape and, as illustrated in FIG. 12, have through holes 7a and 8a, respectively. Consequently, a cavity portion 9 is formed. The cavity portion 9 is provided so that vibration of excitation regions C of the piezoelectric layer 2 is not obstructed. Accordingly, the support member 8 is laminated on the second main surface 2b with the insulating layer 7 interposed therebetween at a position not overlapping a portion at which at least a pair of the electrodes 3 and 4 is provided. Note that the insulating layer 7 need not be provided. Accordingly, the support member 8 is laminated on the second main surface 2b of the piezoelectric layer 2 directly or indirectly.

The insulating layer 7 is made of silicon oxide. However, an appropriate insulating material, other than silicon oxide, such as silicon oxynitride or alumina is usable. The support member 8 is made of Si. The orientation of Si at a surface on the piezoelectric layer 2 side may be (100) or (110), or may be (111). Desirably, the Si of which the support member 8 is made is highly resistive with a resistivity of more than or equal to about 4 kΩ, for example. However, the support member 8 can also be made of an appropriate insulating material or an appropriate semiconductor material.

Examples of materials usable as the material of the support member 8 include a piezoelectric body, such as aluminum oxide, lithium tantalate, lithium niobate, or crystal; various types of ceramic materials, such as alumina, magnesia, sapphire, silicon nitride, aluminum nitride, silicon carbide, zirconia, cordierite, mullite, steatite, or forsterite; a dielectric, such as diamond or glass; or a semiconductor, such as gallium nitride.

The plurality of electrodes 3 and 4 and the first and second busbars 5 and 6 are each made of an appropriate metal or an appropriate alloy, such as Al or an AlCu alloy. In the present preferred embodiment, the electrodes 3 and 4, and the first and second busbars 5 and 6 each have a structure in which an Al film is laminated on a Ti film. Note that a close-contact layer other than the Ti film may be used.

An alternating-current voltage is applied between the plurality of electrodes 3 and the plurality of electrodes 4 to perform driving. More specifically, the alternating-current voltage is applied between the first busbar 5 and the second busbar 6. Consequently, it is possible to obtain resonance characteristics by using bulk waves in a thickness shear mode excited in the piezoelectric layer 2. In addition, in the acoustic wave device 1, when the thickness of the piezoelectric layer 2 is d and the center-to-center distance between the centers of, among the plurality of pairs of electrodes 3 and 4, electrodes 3 and 4 that are adjacent to each other is p, d/p is less than or equal to about 0.5, for example. Therefore, bulk waves in the thickness shear mode are effectively excited, and satisfactory resonance characteristics can be obtained. More preferably, d/p is less than or equal to about 0.24, for example. In this case, more satisfactory resonance characteristics can be obtained.

In the acoustic wave device 1, due to having the aforementioned configuration, the Q-value is unlikely to decrease, even when the number of pairs of the electrodes 3 and 4 is reduced to downsize the acoustic wave device 1. This is because, propagation loss is small even when the number of the electrode fingers of reflectors on both sides is reduced. The number of the electrode fingers can be reduced due to the use of bulk waves in the thickness shear mode. A difference between lamb waves used in an acoustic wave device and bulk waves in the thickness shear mode will be described with reference to FIGS. 13A and 13B.

Figure 13A:
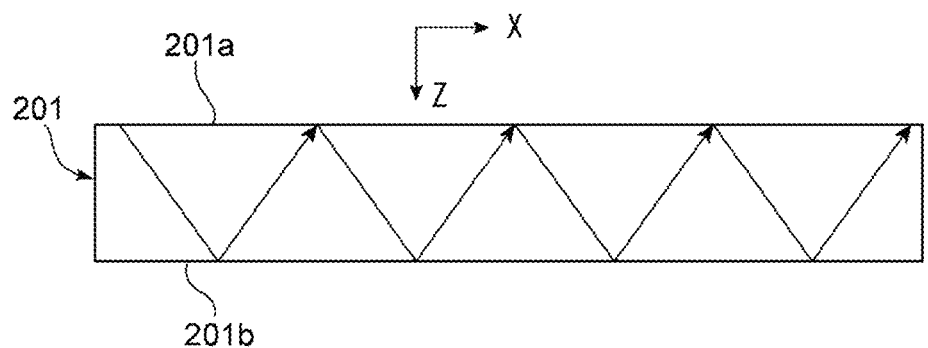
FIG. 13A is a schematic elevational cross-sectional view for describing lamb waves that propagate in a piezoelectric film of an acoustic wave device.

FIG. 13A is a schematic elevational cross-sectional view for describing lamb waves that propagate in a piezoelectric film of an acoustic wave device such as that described in Japanese Unexamined Patent Application Publication No. 2012-257019. Here, waves propagate as indicated by arrows in a piezoelectric film 201. Here, in the piezoelectric film 201, a first main surface 201a and a second main surface 201b face each other, and a thickness direction connecting the first main surface 201a and the second main surface 201b to each other is the Z direction. The X direction is a direction in which electrode fingers of an IDT electrode are disposed side by side. As shown in FIG. 13A, the waves of lamb waves propagate in the X direction in the manner shown in FIG. 13A. Since the waves are plate waves, the waves propagate in the X direction although the piezoelectric film 201 vibrates as a whole. Therefore, reflectors are disposed on two sides to obtain resonance characteristics. Therefore, propagation loss of the waves occurs, and the Q-value decreases when downsizing is performed, in other words, when the number of pairs of the electrode fingers is reduced.

Figure 13B:
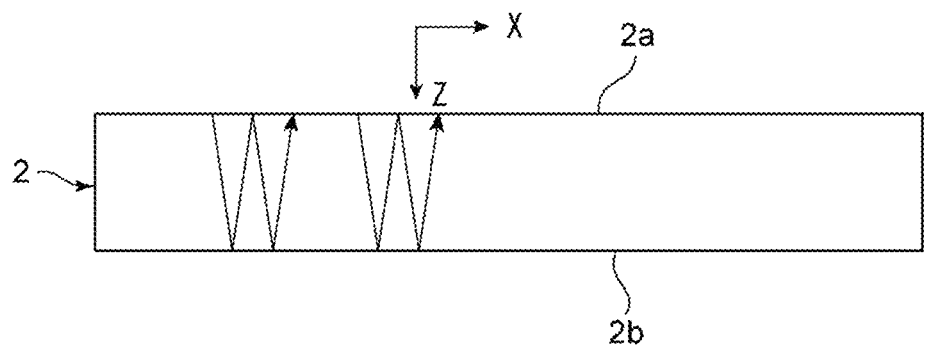
FIG. 13B is a schematic elevational cross-sectional view for describing bulk waves in a thickness shear mode that propagate in the piezoelectric film in the acoustic wave device.

In contrast, as illustrated in FIG. 13B, vibration displacement in the acoustic wave device 1 is in the thickness shear direction, and thus, waves propagate substantially in a direction connecting the first main surface 2a and the second main surface 2b of the piezoelectric layer 2 to each other, that is, in the Z direction and resonates. That is, the X direction component of the waves is significantly smaller than the Z direction component of the waves. Since resonance characteristics are obtained by the propagation of the waves in this Z direction, propagation loss is unlikely to occur even when the number of the electrode fingers of reflectors is reduced. Further, even when the number of pairs of electrode pairs defined by the electrodes 3 and 4 is reduced for downsizing, the Q-value is unlikely to decrease.

Figure 14:
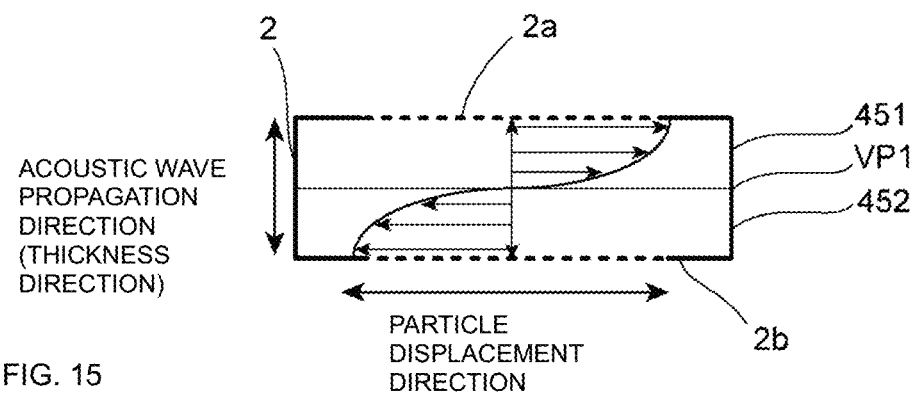
FIG. 14 shows an amplitude direction of bulk waves in a thickness shear mode.

As illustrated in FIG. 14, the amplitude direction of bulk waves in the thickness shear mode for a first excitation region 451 included in the excitation regions C of the piezoelectric layer 2 and the amplitude direction of bulk waves in the thickness shear mode for a second excitation region 452 included in the excitation regions C are opposite to each other. FIG. 14 schematically illustrates bulk waves when a voltage that causes the electrode 4 to have a higher potential than the electrode 3 is applied between the electrode 3 and the electrode 4. The first excitation region 451 is a region included in the excitation regions C and present between the first main surface 2a and an imaginary plane VP1 orthogonal to the thickness direction of the piezoelectric layer 2 and dividing the piezoelectric layer 2 in two. The second excitation region 452 is a region included in the excitation regions C and present between the second main surface 2b and the imaginary plane VP1.

Although, as described above, at least one pair of electrodes defined by the electrode 3 and the electrode 4 is disposed in the acoustic wave device 1, the pair of electrodes is not for causing waves to propagate in the X direction. Therefore, a plurality of electrode pairs defined by the electrode 3 and the electrode 4 are not required. In other words, it is sufficient that at least one pair of the electrodes is provided.

For example, the electrode 3 is an electrode that is connected to a hot potential, and the electrode 4 is an electrode that is connected to a ground potential. However, the electrode 3 may be connected to a ground potential while the electrode 4 may be connected to a hot potential. In the present preferred embodiment, each electrode of at least one pair of electrodes is, as described above, an electrode connected to a hot potential or an electrode connected to a ground potential, and no floating electrode is provided.

Figure 15:
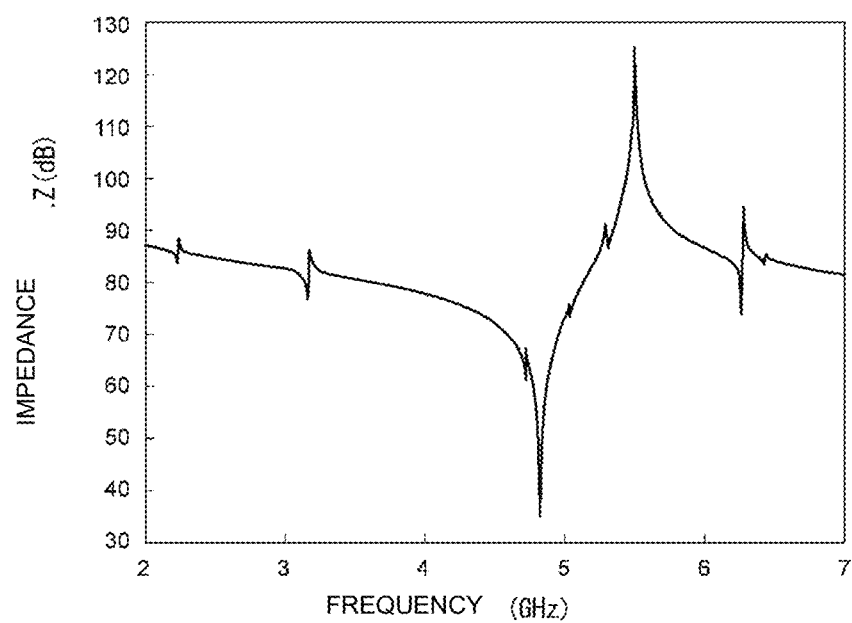
FIG. 15 is a graph showing resonance characteristics of an acoustic wave device using bulk waves in a thickness shear mode.

FIG. 15 is a graph showing resonance characteristics of the acoustic wave device illustrated in FIG. 12. Note that design parameters of an example of the acoustic wave device 1 with which the resonance characteristics are obtained are as follows.

Piezoelectric layer 2: LiNbO$_3$ having Euler angles (0°, 0°, 90°), thickness=400 nm The length of a region in which the electrode 3 and the electrode 4 overlap each other when viewed in a direction orthogonal to the length directions of the electrode 3 and the electrode 4, in other words, the length of each of the excitation regions C=40 μm, the number of pairs of the electrodes defined by the electrodes 3 and 4=21 pairs, the center-to-center distance between the centers of the electrodes=3 μm, the width of each of the electrodes 3 and 4=500 nm, and d/p=0.133

Insulating layer 7: a silicon oxide film having a thickness of 1 μm

Support member 8: Si

Note that the length of each of the excitation regions C is a dimension of each of the excitation regions C in the length directions of the electrodes 3 and 4.

In the present preferred embodiment, the distance between electrodes of an electrode pair defined by the electrodes 3 and 4 is the same among all plurality of the pairs. In other words, the electrodes 3 and the electrodes 4 are disposed at an equal pitch.

FIG. 15 clearly shows that satisfactory resonance characteristics in which the fractional band is 12.5% can be obtained despite the absence of reflectors.

Meanwhile, when the thickness of the piezoelectric layer 2 is d and the electrode center-to-center distance between the center of the electrode 3 and the center of the electrode 4 is p, as described above, in the present preferred embodiment, d/p is less than or equal to about 0.5, and is more preferably less than or equal to about 0.24, for example. This will be described with reference to FIG. 16.

Figure 16:
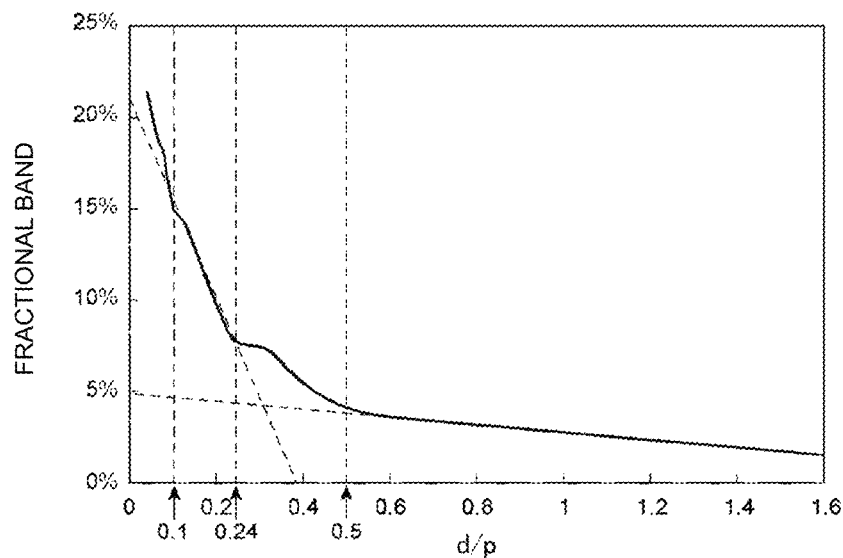
FIG. 16 is a graph showing a relationship between d/p and a fractional band as a resonator, where a center-to-center distance between the centers of adjacent electrodes is p and the thickness of a piezoelectric layer is d.

Similarly to the acoustic wave device with which the resonance characteristics indicated in FIG. 15 were obtained, a plurality of acoustic wave devices were obtained where d/p was varied. FIG. 16 is a graph showing a relationship between the d/p and the fractional band as a resonator of an acoustic wave device.

FIG. 16 clearly shows that, when d/p>about 0.5 is satisfied, the fractional band is less than about 5%, even when d/p is adjusted. In contrast, when d/p≤about 0.5 is satisfied, it is possible to cause the fractional band to be more than or equal to about 5% by changing d/p within the range. In other words, it is possible to provide a resonator that has a high coupling coefficient. When d/p is less than or equal to about 0.24, the fractional band can be increased to be more than or equal to about 7%, for example. In addition, by adjusting d/p within this range, it is possible to obtain a resonator having a wider fractional band and to realize a resonator having a higher coupling coefficient. Accordingly, it was discovered and confirmed that, by setting d/p to be less than or equal to about 0.5, for example, it is possible to form a resonator using bulk waves in the thickness shear mode and that has a high coupling coefficient.

Figure 17:
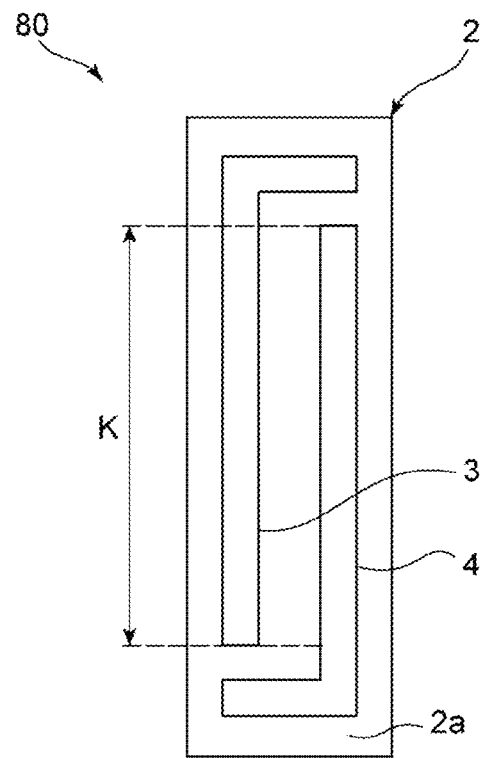
FIG. 17 is a plan view of an acoustic wave device using bulk waves in a thickness shear mode.

FIG. 17 is a plan view of an acoustic wave device using bulk waves in a thickness shear mode. In an acoustic wave device 80, a pair of electrodes including an electrode 3 and an electrode 4 is provided on a first main surface 2a of a piezoelectric layer 2. Note that, in FIG. 17, K is an intersection width. As described above, the number of pairs of electrodes may be one in the acoustic wave device according to a preferred embodiment of the present invention. Even in this case, it is also possible to effectively excite bulk waves in a thickness shear mode when the aforementioned d/p is less than or equal to about 0.5, for example.

Figure 18:
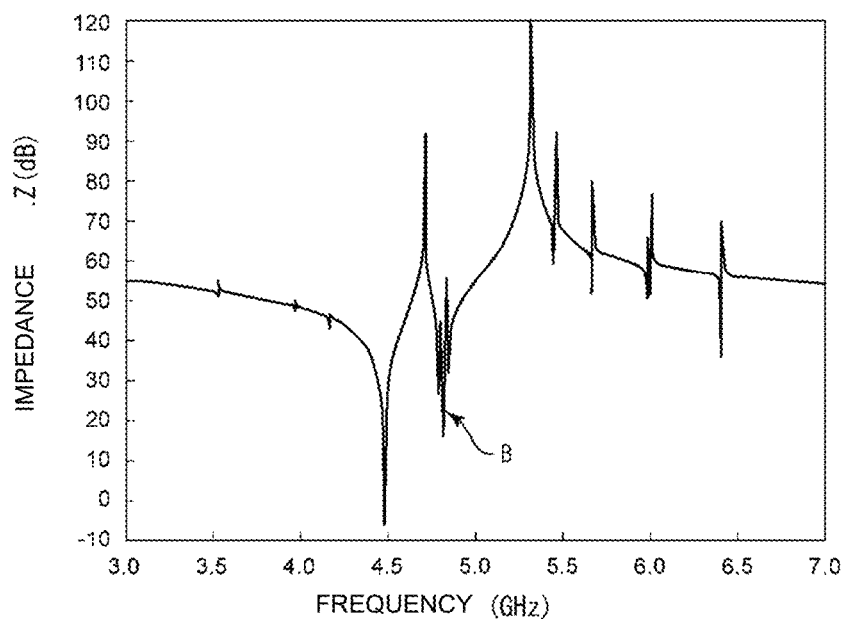
FIG. 18 is a graph showing resonance characteristics of an acoustic wave device of a reference example in which a spurious appears.

Preferably, in the acoustic wave device 1, a metallization ratio MR of, among a plurality of electrodes 3 and 4, electrodes 3 and 4 adjacent to each other with respect to an excitation region C, which is a region in which the electrodes 3 and 4 adjacent to each other overlap each other when viewed in a direction in which the electrodes 3 and 4 adjacent to each other face each other, satisfies MR≤about 1.75(d/p)+0.075. In such a case, it is possible to effectively cause a spurious to be small. This will be described with reference to FIG. 18 and FIG. 19. FIG. 18 is a reference graph showing one example of resonance characteristics of the acoustic wave device 1. A spurious indicated by arrow B appears between the resonant frequency and the anti-resonant frequency. Note that d/p=about 0.08 and LiNbO$_3$ has Euler angles (0°, 0°, 90°). In addition, the metallization ratio MR=about 0.35.

The metallization ratio MR will be described with reference to FIG. 11B. When one pair of electrodes 3 and 4 is focused upon in the electrode structure in FIG. 11B, it is assumed that only this one pair of electrodes 3 and 4 is provided. In this case, a portion surrounded by an alternate long and short dashed line is an excitation region C. This excitation region C is a region in the electrode 3 overlapping the electrode 4, a region in the electrode 4 overlapping the electrode 3, and a region in which the electrode 3 and the electrode 4 overlap each other in a region between the electrode 3 and the electrode 4, when the electrode 3 and the electrode 4 are viewed in a direction orthogonal to the length directions of the electrodes 3 and 4, that is, in the facing direction. The ratio of the areas of the electrodes 3 and 4 in the excitation region C to the area of this excitation region C is the metallization ratio MR. In other words, the metallization ratio MR is a ratio of the area of a metallization portion to the area of the excitation region C.

When a plurality of pairs of electrodes are provided, a ratio of the metallization portion included in all excitation regions to the total of the areas of the excitation regions can be considered as MR.

Figure 19:
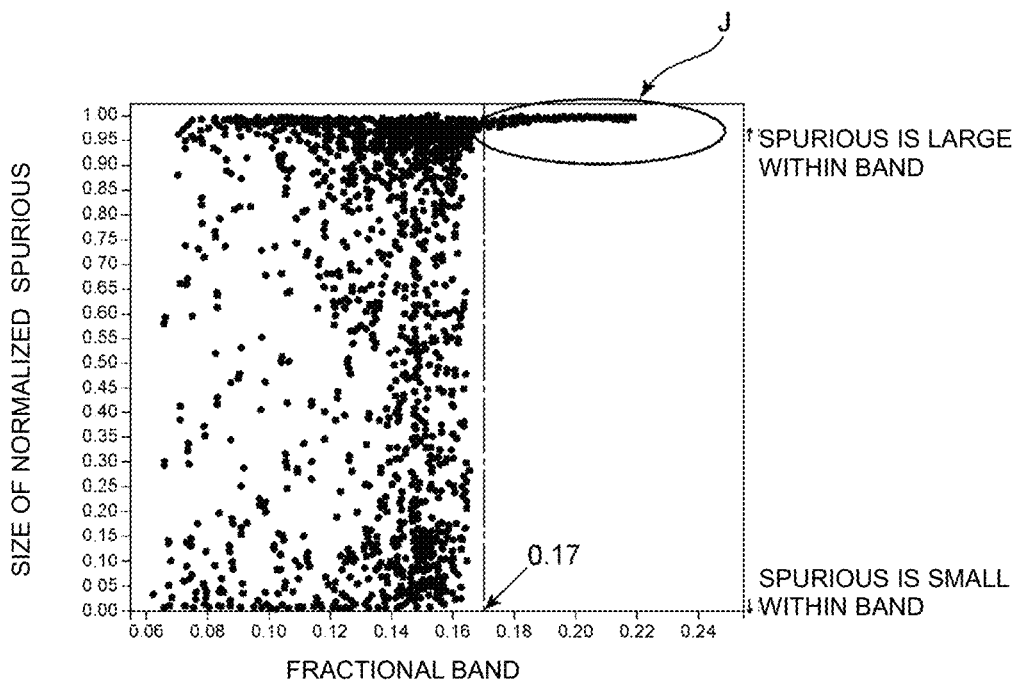
FIG. 19 is a graph showing a relationship between a fractional band and the phase rotation amount of an impedance of a spurious normalized by 180 degrees as the size of the spurious.

FIG. 19 is a graph showing a relationship between a fractional band when a large number of acoustic wave resonators are formed according to the present preferred embodiment and the phase rotation amount of an impedance of a spurious normalized by 180 degrees as the size of the spurious. Note that the fractional band was adjusted by variously changing the film thickness of the piezoelectric layer and the dimensions of the electrodes. FIG. 19 shows results when a piezoelectric layer made of Z-cut LiNbO$_3$ was used. However, a case where a piezoelectric layer of other cut-angles is used has the same tendency.

The spurious is about 1.0, which is large, in a region surrounded by the ellipse J in FIG. 19. FIG. 19 clearly shows that when the fractional band exceeds about 0.17, in other words, exceeds about 17%, a large spurious whose spurious level is more than or equal to 1 appears in the pass band even when parameters that define the fractional band are changed. In other words, as with the resonance characteristics shown in FIG. 18, a large spurious indicated by the arrow B appears in the band. Therefore, the fractional band is preferably less than or equal to about 17%. In this case, it is possible to cause the spurious to be small by adjusting the film thickness of the piezoelectric layer 2, the dimensions of the electrodes 3 and 4, and the like.

Figure 20:
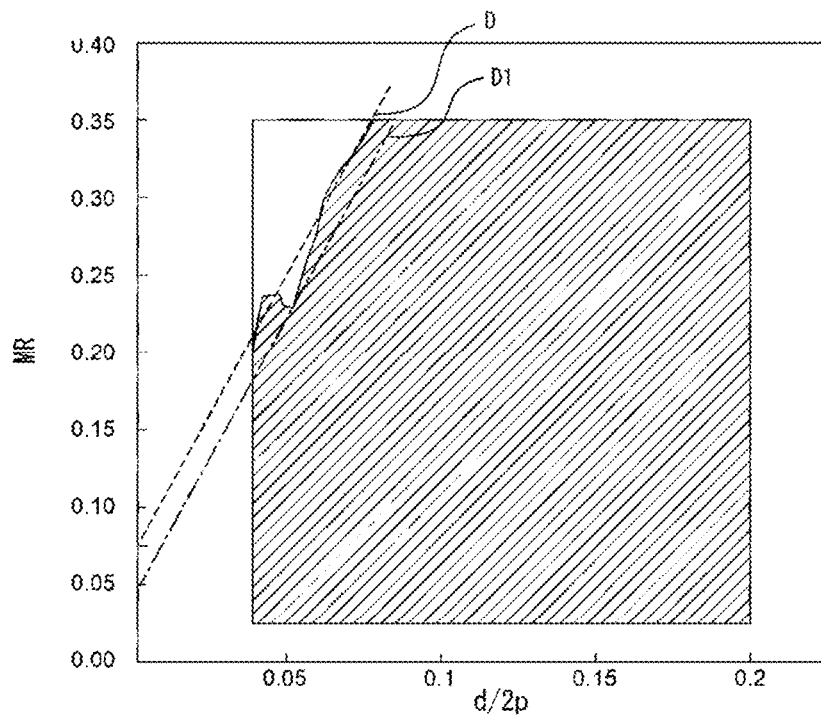
FIG. 20 is a graph showing a relationship between d/2p and a metallization ratio MR.

FIG. 20 is a graph showing a relationship among d/2p, the metallization ratio MR, and the fractional band. Various acoustic wave devices in which d/2p and MR differed in the above-described acoustic wave device were formed, and the fractional band was measured. In FIG. 20, the hatched portion on the right side of the dashed line D is a region in which the fractional band is less than or equal to about 17%. The boundary between the hatched region and a non-hatched region is expressed by MR=about 3.5(d/2p)+0.075. In other words, MR=about 1.75(d/p)+0.075. Thus, preferably, MR≤about 1.75(d/p)+0.075. In such a case, the fractional band is likely to be less than or equal to about 17%. A region on the right side of MR=about 3.5(d/2p)+0.05 indicated by the alternate long and shorted dashed line D1 in FIG. 20 is more preferable. In other words, when MR≤about 1.75(d/p)+0.05 is satisfied, it is possible to reliably cause the fractional band to be less than or equal to about 17%, for example.

Figure 21:
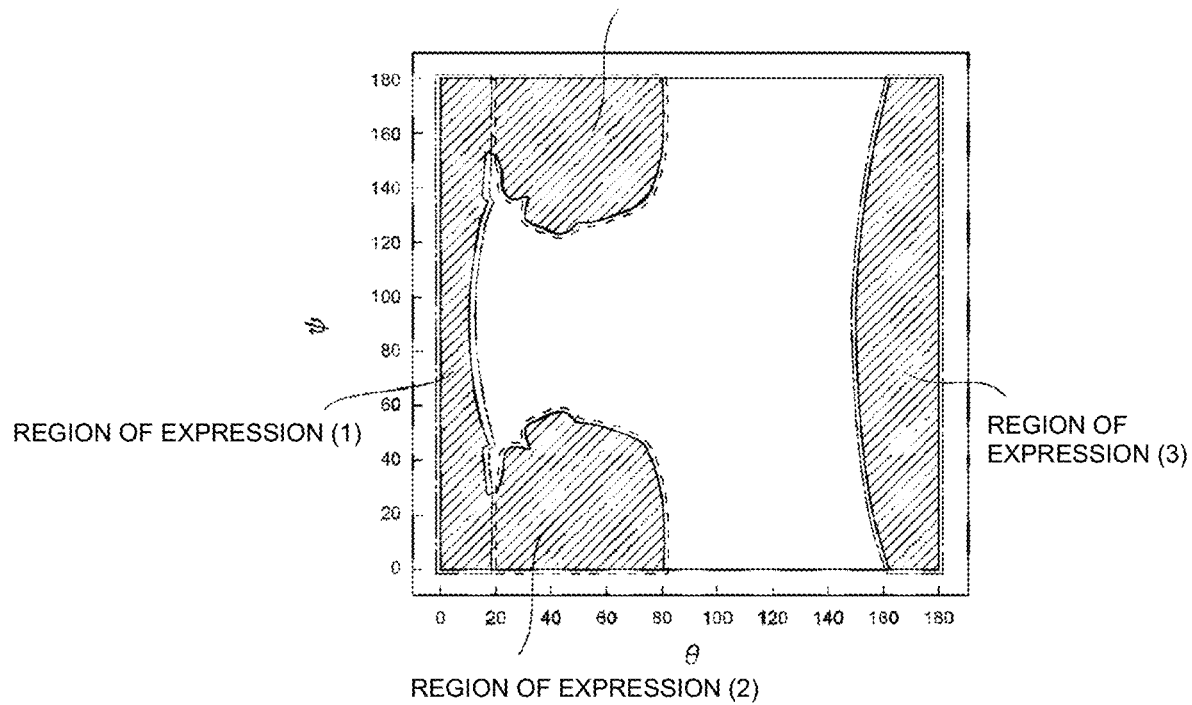
FIG. 21 is a graph showing a map of a fractional band with respect to Euler angles (0°, θ, ψ) of LiNbO$_3$ when d/p is set as close as possible to zero.

FIG. 21 is a graph showing a map of the fractional band with respect to the Euler angles (0°, θ, ψ) of LiNbO$_3$ when d/p is set as close as possible to zero. The hatched portion in FIG. 21 is a region in which a fractional band of at least more than or equal to about 5% is obtained. When the range of the region is approximated, the range is expressed by Expression (1), Expression (2), and Expression (3) below.

$$(0°\pm10°, 0° \text{ to } 20°, \text{optional } \psi) \quad (1)$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad (2)$$

$$(0°\pm10°, [180°-30°(1-(\psi-90)^2/8100)^{1/2}] \text{ to } 180°, \text{optional } \psi) \quad (3)$$

Accordingly, in the Euler angle range expressed by Expression (1), Expression (2), or Expression (3) above, the fractional band can be sufficiently widened, which is preferable. This is also true when the piezoelectric layer 2 is a lithium tantalate layer.

Figure 22:
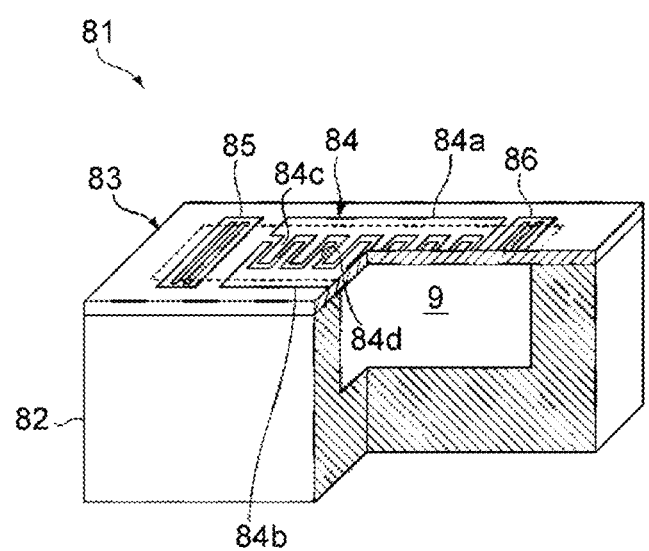
FIG. 22 is a partial cutaway perspective view for describing an acoustic wave device using lamb waves.

FIG. 22 is a partial cutaway perspective view for describing an acoustic wave device using lamb waves.

An acoustic wave device 81 includes a support substrate 82. A recessed portion having an open upper side is provided in the support substrate 82. A piezoelectric layer 83 is laminated to the support substrate 82. Therefore, a cavity portion 9 is formed. An IDT electrode 84 is provided on the piezoelectric layer 83 above the cavity portion 9. Reflectors 85 and 86 are provided on a corresponding one of two sides of the IDT electrode 84 in an acoustic-wave propagation direction. In FIG. 22, an outer peripheral edge of the cavity portion 9 is shown by a broken line. Here, the IDT electrode 84 includes a first busbar 84a, a second busbar 84b, a plurality of first electrode fingers 84c, and a plurality of second electrode fingers 84d. The plurality of first electrode fingers 84c are connected to the first busbar 84a. The plurality of second electrode fingers 84d are connected to the second busbar 84b. The plurality of first electrode fingers 84c and the plurality of second electrode fingers 84d interdigitate with each other.

In the acoustic wave device 81, lamb waves, which are plate waves, are excited by applying an alternating-current electric field to the IDT electrode 84 above the aforementioned cavity portion 9. Since the reflectors 85 and 86 are provided on the corresponding one of the two sides of the IDT electrode 84, it is possible to obtain resonance characteristics by the aforementioned lamb waves.

Accordingly, the acoustic wave device according to a preferred embodiment of the present invention may be one that uses plate waves. In this case, it is sufficient for the IDT electrode 84, the reflector 85, and the reflector 86, which are shown in FIG. 22, to be provided on the piezoelectric layer in the first preferred embodiment to the fourth preferred embodiment and each modification above.

In the acoustic wave devices, which use bulk waves in the thickness shear mode, of the first preferred embodiment to the fourth preferred embodiment and each modification, as mentioned above, d/p is preferably less than or equal to about 0.5 and, more preferably, less than or equal to about 0.24, for example. This makes it possible to obtain more satisfactory resonance characteristics. Further, in the acoustic wave devices, which use bulk waves in the thickness shear mode, of the first preferred embodiment to the fourth preferred embodiment and each modification, as mentioned above, it is preferable that MR≤about 1.75(d/p)+0.075 be satisfied. In this case, it is possible to more reliably reduce or prevent a spurious.

The piezoelectric layer in the acoustic wave devices, which use bulk waves in the thickness shear mode, of the first preferred embodiment to the fourth preferred embodiment and each modification is preferably made of lithium niobate or lithium tantalate. The Euler angles (φ, θ, ψ) of the lithium niobate or the lithium tantalate of which the piezoelectric layer is made is preferably in the range of Expression (1), Expression (2), or Expression (3) above. In this case, it is possible to sufficiently widen the fractional band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate;
a piezoelectric layer on the support;
an interdigital terminal (IDT) electrode on the piezoelectric layer and including a first busbar and a second busbar facing each other and a plurality of electrode fingers; and
a first insulating film on the piezoelectric layer and covers tip end portions of the plurality of electrode fingers facing the first busbar; wherein
in a multilayer body including the support and the piezoelectric layer, a cavity is provided on a side of the support with respect to the piezoelectric layer, and, in plan view, at least a portion of the IDT electrode overlaps the cavity; wherein
when a direction in which the plurality of electrode fingers extend is an electrode-finger extending direction, in plan view, an outer peripheral edge of the cavity includes a first outer peripheral edge portion and a second outer peripheral edge portion facing each other in the electrode-finger extending direction, and, of the first outer peripheral edge portion and the second outer peripheral edge portion, the first outer peripheral edge portion is positioned on a side of the first busbar, and
the first insulating film extends on the side of the first busbar, and, in plan view, overlaps the first outer peripheral edge portion of the cavity.

2. The acoustic wave device according to claim 1, further comprising:
a second insulating film that covers tip end portions of the plurality of electrode fingers facing the second busbar; wherein
the second insulating film extends on a side of the second busbar, and, in plan view, overlaps the second outer peripheral edge portion of the cavity.

3. The acoustic wave device according to claim 2, wherein a region in which adjacent ones of the electrode fingers overlap each other when viewed in a direction in which the plurality of electrode fingers are side by side is an intersection region, and the first insulating film and the second insulating film are not provided at a portion of the intersection region.

4. The acoustic wave device according to claim 2, wherein the first insulating film and the second insulating film are integrated with each other and are one insulating film.

5. The acoustic wave device according to claim 2, wherein the first insulating film and the second insulating film are separate films.

6. The acoustic wave device according to claim 2, wherein the first insulating film and the second insulating film are each a resin film.

7. The acoustic wave device according to claim 2, wherein the first insulating film and the second insulating film are each an inorganic insulating film.

8. The acoustic wave device according to claim 1, wherein
the support includes a joining layer between the support substrate and the piezoelectric layer; and
the cavity is located in the joining layer.

9. The acoustic wave device according to claim 1, wherein the cavity is located in the support substrate.

10. The acoustic wave device according to claim 1, wherein the acoustic wave device is structured to generate a plate wave.

11. The acoustic wave device according to claim 1, wherein a ratio d/p is less than or equal to about 0.5, where a thickness of the piezoelectric layer is d and a center-to-center distance between centers of adjacent ones of the electrode fingers is p.

12. The acoustic wave device according to claim 11, wherein the ratio d/p is less than or equal to about 0.24.

13. The acoustic wave device according to claim 11, wherein a region in which the adjacent ones of the electrode fingers overlap each other when viewed in a direction in which the plurality of electrode fingers are side by side is an intersection region, and MR≤about 1.75(d/p)+0.075 is satisfied, where a metallization ratio of the plurality of electrode fingers with respect to the intersection region is MR.

14. The acoustic wave device according to claim 11, wherein
the piezoelectric layer is made of lithium niobate or lithium tantalate; and
Euler angles ($\phi$, $\theta$, $\psi$) of the lithium niobate or the lithium tantalate are in a range of Expression (1), Expression (2), or Expression (3):

$$(0°\pm10°, 0° \text{ to } 20°, \text{optional } \psi) \tag{1}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \tag{2; and}$$

$$(0°\pm10°, [180°-30°(1-(\psi-90)^2/8100)^{1/2}] \text{ to } 180°, \text{optional } \psi). \tag{3}$$

15. The acoustic wave device according to claim 1, wherein the piezoelectric layer is made of lithium niobate or lithium tantalate.

16. The acoustic wave device according to claim 1, wherein the cavity is a through hole.

17. The acoustic wave device according to claim 8, wherein the cavity is a through hole extending to the support substrate and to the joining layer.

18. The acoustic wave device according to claim 1, wherein the cavity has a rectangular or substantially rectangular shape.

19. The acoustic wave device according to claim 1, wherein the acoustic wave device is structured to generate a bulk wave in a thickness shear mode.

20. The acoustic wave device according to claim 1, wherein the acoustic wave device is structured to generate a Lamb wave.

* * * * *